United States Patent [19]

Asai et al.

[11] Patent Number: 5,330,583
[45] Date of Patent: Jul. 19, 1994

[54] SOLAR BATTERY MODULE

[75] Inventors: Masahito Asai, Nara; Shinichi Nakajima, Osaka, both of Japan

[73] Assignee: Sharp Kabushiki Kaisha, Osaka, Japan

[21] Appl. No.: 952,665

[22] Filed: Sep. 28, 1992

[30] Foreign Application Priority Data

Sep. 30, 1991 [JP] Japan ................................ 3-251938
Jun. 5, 1992 [JP] Japan ................................ 4-145844

[51] Int. Cl.$^5$ .................... H01L 31/05; H01L 31/048
[52] U.S. Cl. .................................... 136/251; 136/244
[58] Field of Search ............................ 136/244, 251

[56] References Cited

U.S. PATENT DOCUMENTS

| | | | |
|---|---|---|---|
| 4,167,644 | 9/1979 | Kurth et al. | 136/251 |
| 4,367,365 | 1/1983 | Spencer | 136/244 |
| 4,481,378 | 11/1984 | Lesk | 136/244 |
| 4,759,803 | 7/1988 | Cohen | 136/244 |

FOREIGN PATENT DOCUMENTS

| | | | |
|---|---|---|---|
| 0121095 | 10/1984 | European Pat. Off. | 136/244 |
| 0369666 | 5/1990 | European Pat. Off. | 136/255 |
| 3005560 | 8/1981 | Fed. Rep. of Germany | 136/244 |
| 55-11325 | 1/1980 | Japan | 136/244 |
| 56-069871 | 6/1981 | Japan | 136/244 |
| 58-56368 | 4/1983 | Japan | 136/244 |
| 60-1872 | 1/1985 | Japan | 136/244 |
| 1-260864 | 10/1989 | Japan | 136/244 |
| 02-298080 | 12/1990 | Japan | 136/255 |
| 2-298080 | 12/1990 | Japan | 136/244 |

OTHER PUBLICATIONS

"By-Pass Diode Design, Application and Reliability Studies for Solar Cell Arrays", Giuliano et al, The Conference Record of the 15th IEEE Photovoltaic Specialists Conference 1981, Kissimee, Florida, U.S., May 12, 1981, pp. 997-1000.

*Primary Examiner*—Aaron Weisstuch
*Attorney, Agent, or Firm*—Nixon & Vanderhye

[57] ABSTRACT

A solar battery module according to the present invention includes interconnectors for series-connecting a plurality of solar battery cells, and one or more bypass diodes which allow output currents of the cells to be bypassed with respect to one or more cells, wherein each of those diodes is a chip shaped thin diode and is attached on an electrode or a cell or between interconnectors.

15 Claims, 29 Drawing Sheets

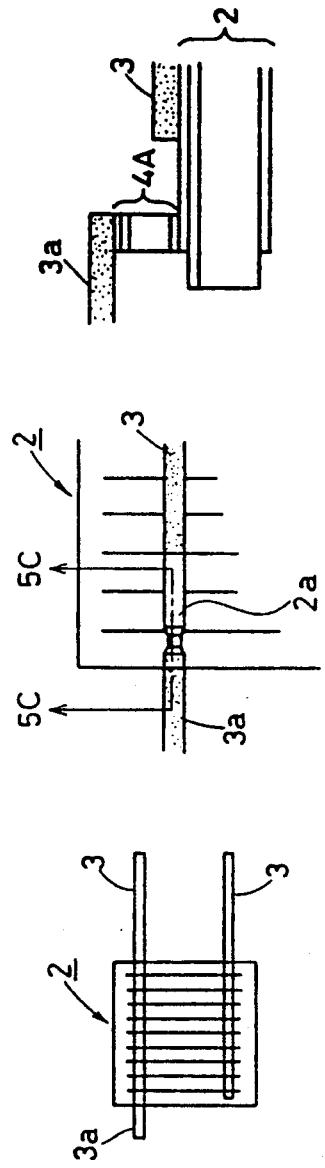

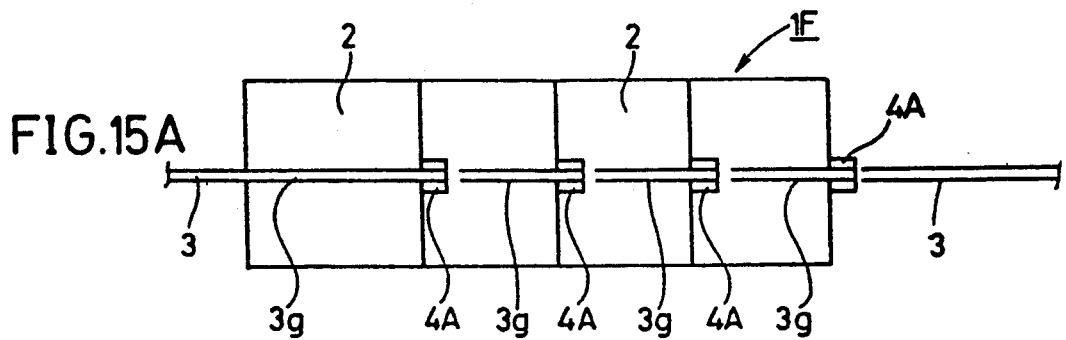
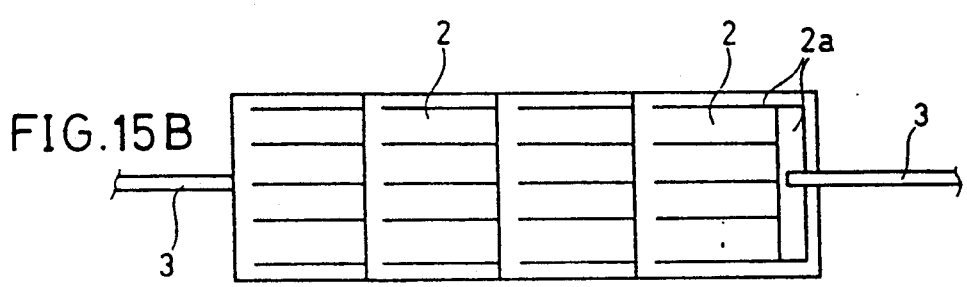
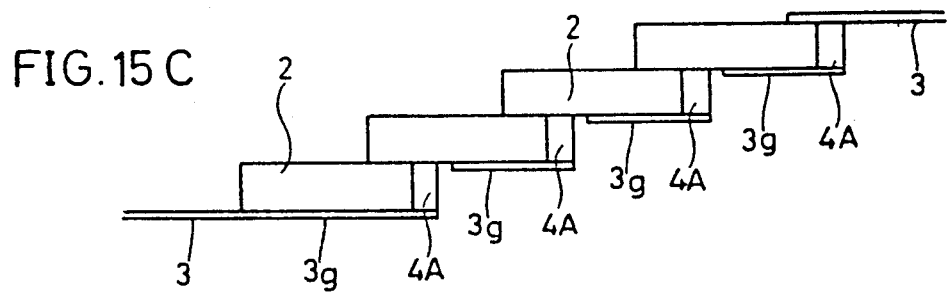
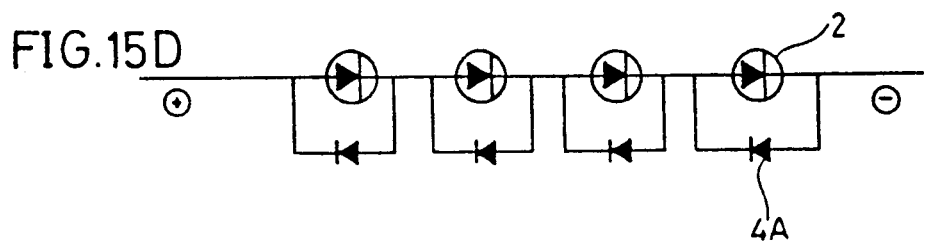

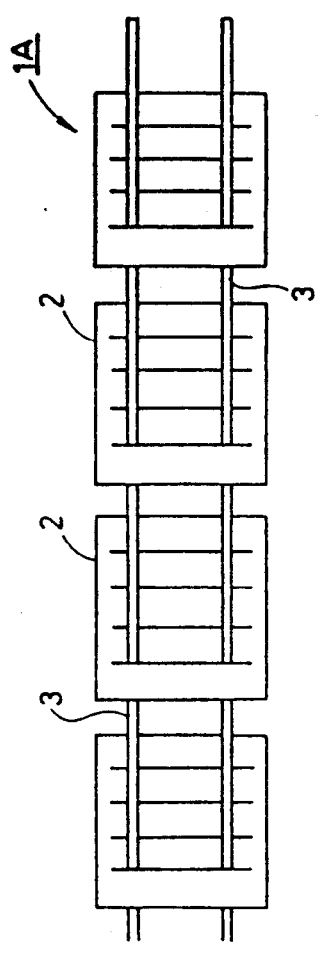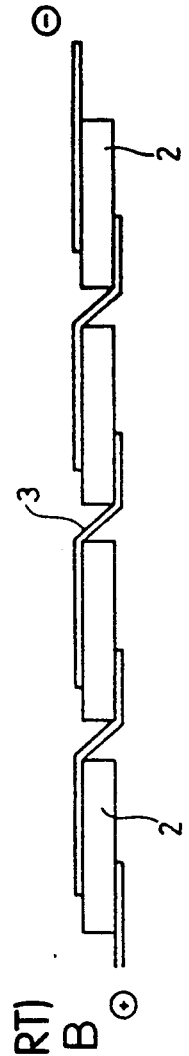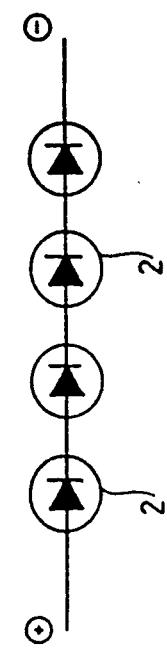
(PRIOR ART) FIG. 19A
(PRIOR ART) FIG. 19B
(PRIOR ART) FIG. 19C

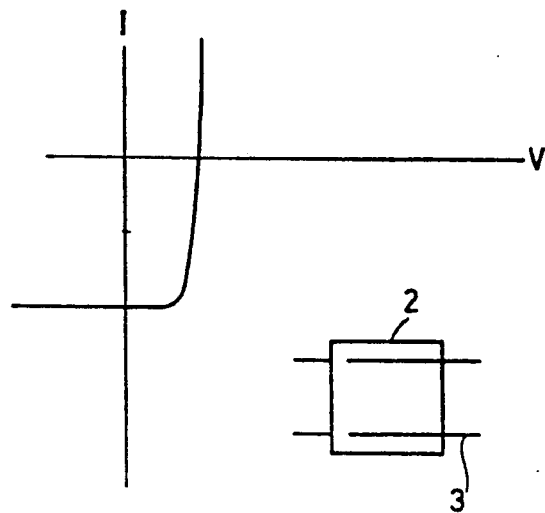
(PRIOR ART) FIG. 20A
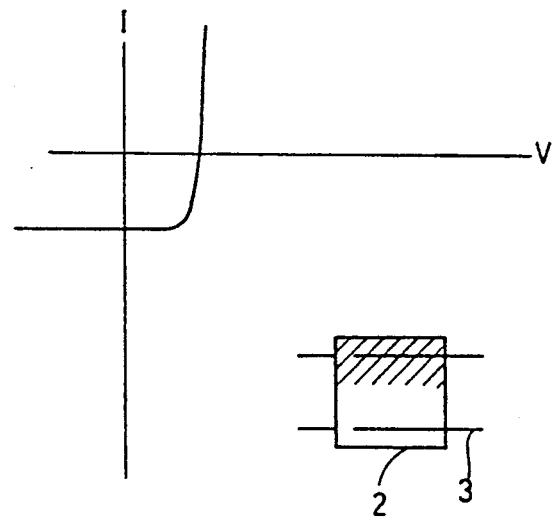
(PRIOR ART) FIG. 20B

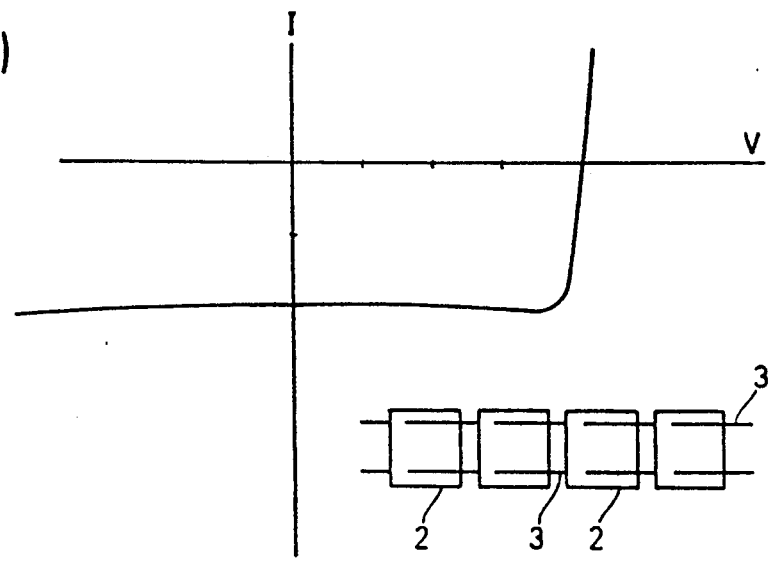
(PRIOR ART) FIG. 21A
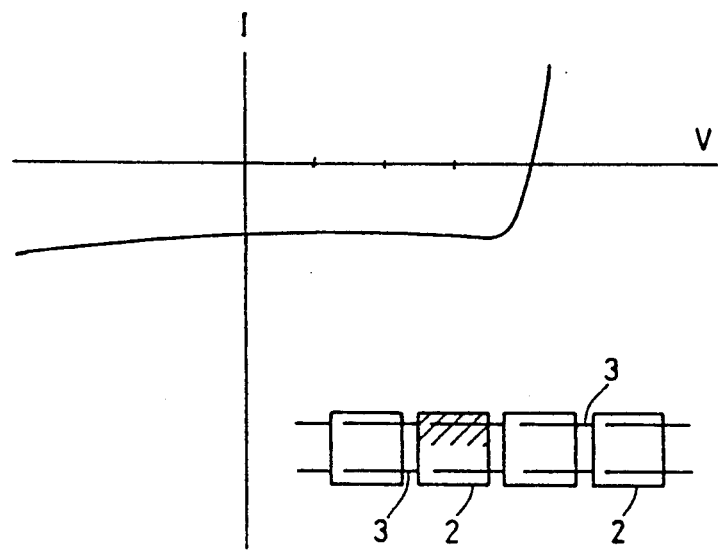
(PRIOR ART) FIG. 21B

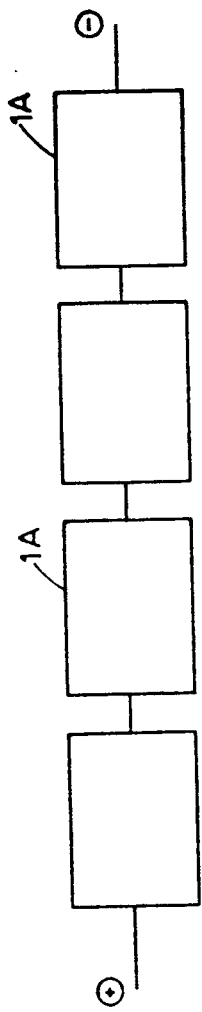
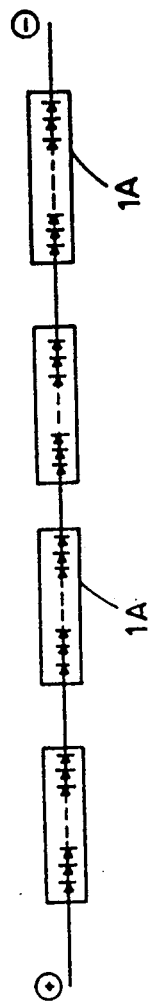
FIG. 22A (PRIOR ART)
FIG. 22B (PRIOR ART)

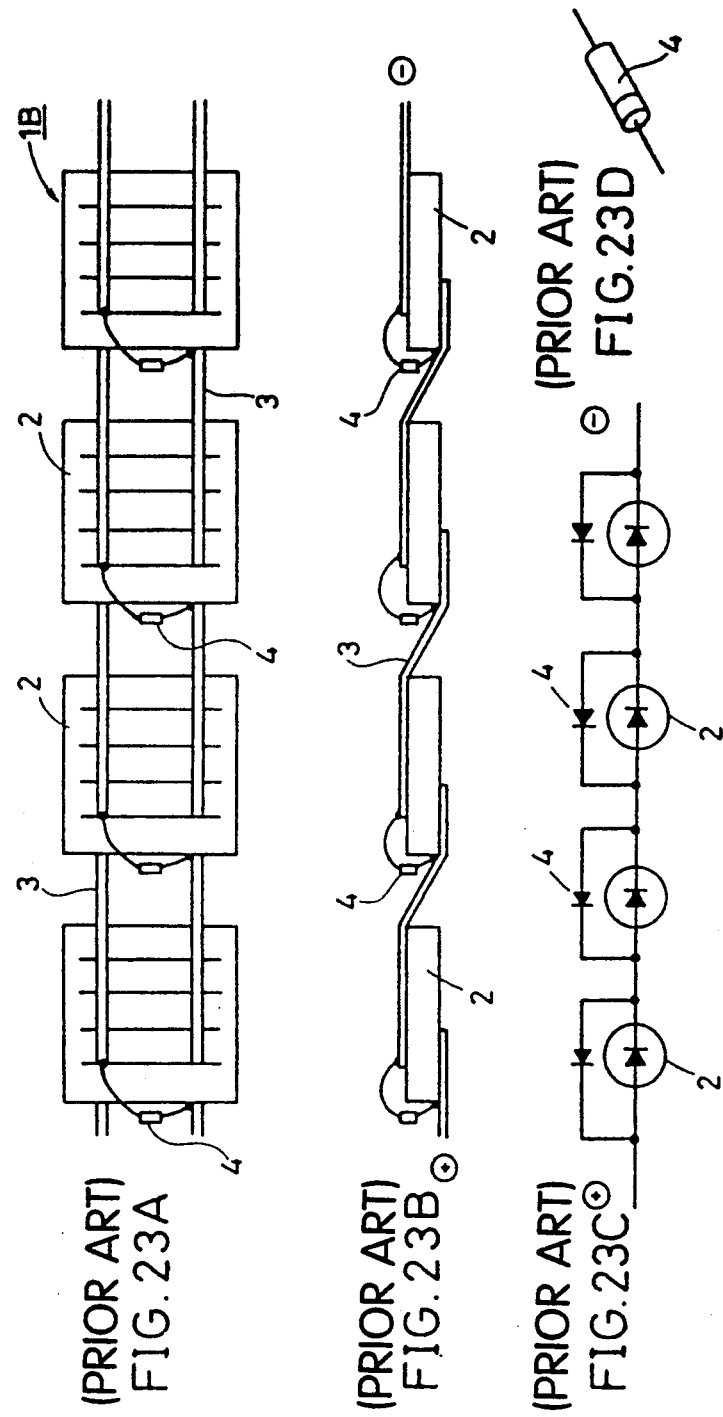

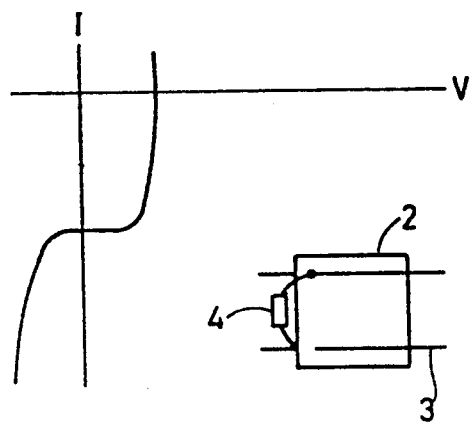
(PRIOR ART) FIG. 24A
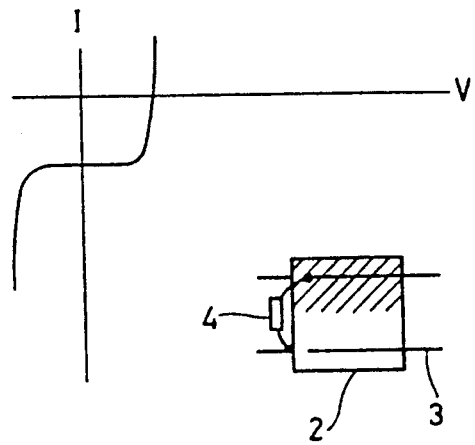
(PRIOR ART) FIG. 24B

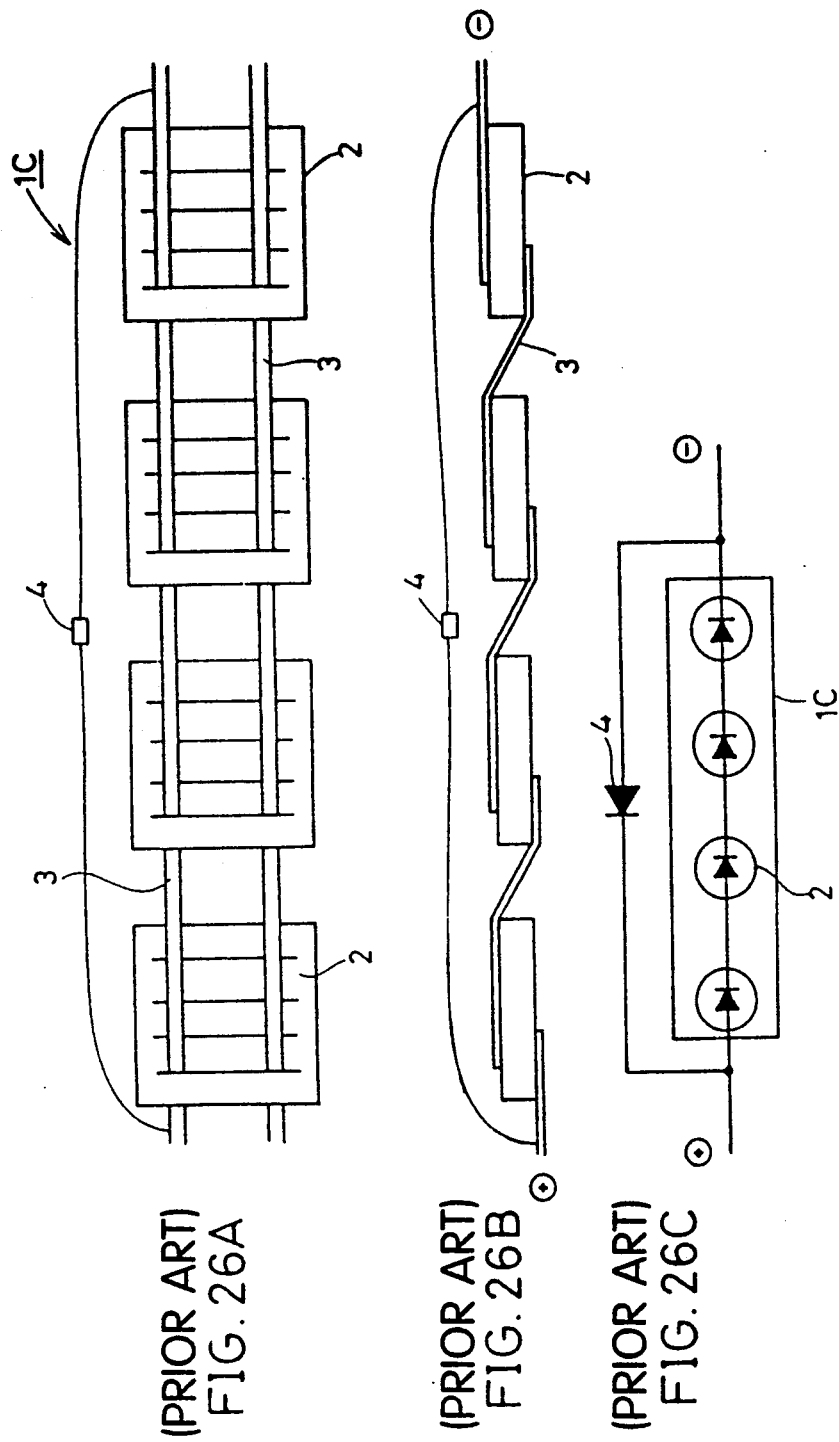
(PRIOR ART) FIG. 26A
(PRIOR ART) FIG. 26B
(PRIOR ART) FIG. 26C

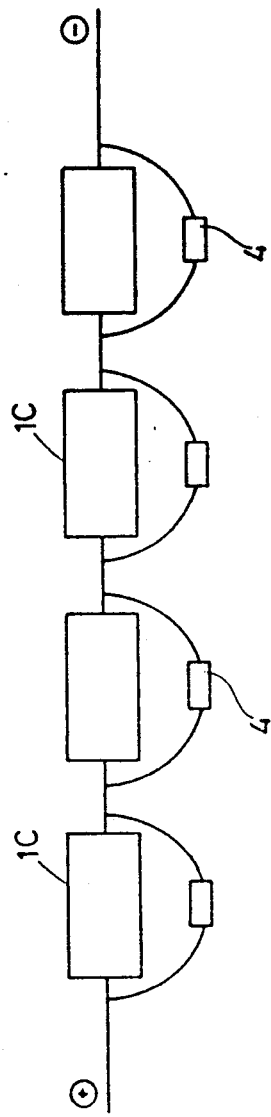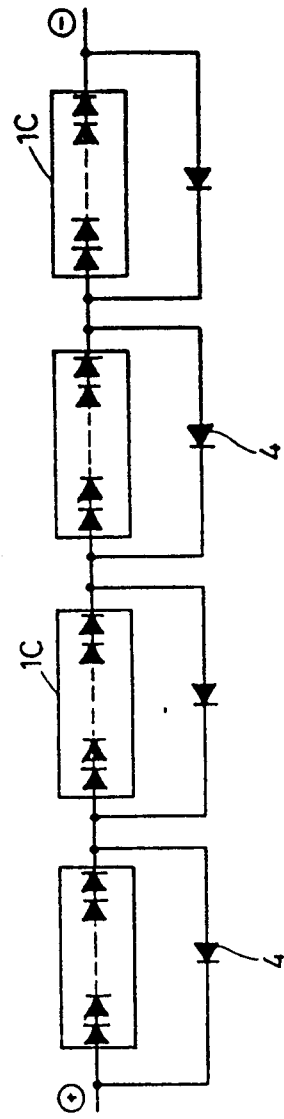
(PRIOR ART) FIG. 27A
(PRIOR ART) FIG. 27B

SOLAR BATTERY MODULE

BACKGROUND OF THE INVENTION

1. Field of the Invention

The present invention relates generally to a solar battery module including a plurality of solar battery cells which are electrically series-connected and, more particularly, to improvements of a solar battery module including a bypass diode allowing output currents of solar battery cells to be bypassed.

2. Description of the Background Art

With reference to FIGS. 19A, 19B, and 19C, one example of a conventional solar battery module is illustrated. FIGS. 19A, 19B, and 19C show, respectively, a top plan view, a longitudinal cross-sectional view and an equivalent circuit diagram of the solar battery module. In general, a solar battery module 1A includes a plurality of solar battery cells 2 which are electrically series-connected by an interconnector 3 so as to obtain a desired output voltage. In the solar battery module 1A having such structure that the plurality of solar battery cells 2 are series-connected, however, even in a case o where one solar battery cell 2 in the module is shaded, whereas other cells 2 are unshaded, the solar battery module 1A is greatly affected by the single shaded cell, resulting in a substantial decrease in the output of the entire module 1A.

FIGS. 20A and 20B show output voltage-current (V-I) characteristics of one solar battery cell 2. In the graph of each of FIGS. 20A and 20B, the horizontal axis represents voltage V, and the vertical axis represents current I. FIG. 20A shows V-I characteristics provided when one entire solar battery cell 2 is irradiated with light, and FIG. 20B shows V-I characteristics provided when about a half of one solar battery cell 2 is shaded. As can be understood from a comparison between FIGS. 20A and 20B, the output current I of the half-shaded solar battery cell 2 decreases to approximately one-half that of the cell 2 which is entirely irradiated with light.

FIGS. 21A and 21B are similar to FIGS. 20A and 20B and show V-I characteristics of a complete solar battery module 1A. FIG. 21A shows V-I characteristics provided when all of the solar battery cells 2 in the module 1A are irradiated with light, and FIG. 21B shows V-I characteristics provided when approximately one-half of one solar battery cell 2 in the module 1A is shaded. As will be apparent from a comparison between FIGS. 21A and 21B, even in the case where approximately one-half of a single solar battery cell 2 in the module 1A is shaded, the solar battery module 1A is affected such that the output current I of the entire module 1A decreases by approximately one-half.

With reference to FIGS. 22A and 22B, one example of a solar battery system in which a plurality of solar battery modules 1A are further series-connected is schematically shown. FIGS. 22A and 22B show, respectively, a block diagram and an equivalent circuit diagram of that solar battery system. In this solar battery system also, even if only one of the solar battery cells in the system is shaded, the same output decrease as shown in FIG. 21B occurs.

Moreover, in the above-described solar battery module and solar battery system, a large reverse bias voltage is applied to a shaded solar battery cell, so that the shaded cell is destroyed, depending on the external circuit connected with the solar battery module or the solar battery system. In an extreme case, solar battery cells are overheated by the reverse bias voltage, causing a fire in the case where a solar battery module is installed on a roof.

In order to eliminate the problems of the output decrease in the solar battery module or the breakdown of the cell, a solar battery module incorporating a bypass diode is known in the prior art.

FIGS. 23A, 23B, and 23C are similar to FIGS. 19A, 19B, and 19C and illustrate an example of a solar battery module incorporating a bypass diode according to the prior art. FIGS. 23A, 23B, and 23C show, respectively, a top plan view, a longitudinal cross-sectional view, and an equivalent circuit diagram of a solar battery module 1B. FIG. 23D is a perspective view showing one bypass diode. In this solar battery module 1B, bypass diodes 4 are connected in parallel in reverse polarity with respect to respective solar battery cells 2 included in the module 1B.

FIGS. 24A, 24B, 25A, and 25B are similar to FIGS. 20A, 20B, 21A, and 21B, respectively, and show output V-I characteristics of the solar battery module 1B of FIG. 23A. FIGS. 24A and 24B show output V-I characteristics of a single solar battery cell 2 incorporating a bypass diode 4. As can be understood from a comparison with FIGS. 20A and 20B, when there is one solar battery cell 2, the bypass diode 4 does not reduce the decrease in the output of the shaded solar battery cell 2. When a reverse bias voltage externally acts on the solar battery cell 2, however, the bypass diode 4 can act to release the reverse bias voltage and protect the solar battery cell 2 from destruction due to the reverse bias voltage.

FIGS. 25A shows V-I characteristics provided when all of the solar battery cells 2 in the solar battery module 1B of FIG. 23A are irradiated with light, and FIG. 25B shows V-I characteristics provided when approximately one-half of one solar battery cell 2 in the module 1B is shaded.

As can be understood from a comparison between FIGS. 25B and 21B, the bypass diode 4 can act to minimize a decrease in the output of the entire module 1B when a portion of the solar battery cells 2 in the solar battery module 1B are shaded.

With reference to FIGS. 26A, 26B, and 26C, an example of a solar battery module incorporating one bypass diode is illustrated. FIGS. 26A, 26B, and 26C show, respectively, a top plan view, a longitudinal cross-sectional view, and an equivalent circuit diagram of a solar battery module 1C. The solar battery module 1C including a desired number of series-connected solar battery cells 2 includes one bypass diode 4 connected in parallel in a reverse polarity to the solar battery module 1C. When a portion of the solar battery cells 2 in the solar battery module 1C is shaded, this bypass diode 4 does not reduce the decrease in the output of the entire module 1C; however, when a reverse bias voltage acts on the module 1C, the bypass diode 4 can act to protect the entire module 1C from breakdown due to the applied reverse bias voltage.

With reference to FIGS. 27A and 27B, a solar battery system including one bypass diode for each solar battery module is schematically illustrated. FIGS. 27A and 27B show, respectively, a block diagram and an equivalent circuit diagram of that solar battery system. This solar battery system includes a plurality of series-connected solar battery modules 1C, each solar battery module 1C including one bypass diode 4. These bypass diodes 4 can act to reduce the decrease in the output of the entire solar battery system even in a case where a portion of the solar battery cells in the solar battery modules 1C is shaded.

With reference to FIGS. 28A, 28B, and 28C, another example of a conventional solar battery module is illustrated. FIGS. 28A, 28B, and 28C show, respectively, a top view, a longitudinal cross-section view, and an equivalent circuit diagram of a solar battery module 1D. The module 1D of FIGS. 28A, 28B, and 28C is similar to the module 1A of FIGS. 19A, 19B, and 19C; however, with reference to FIGS. 28A, 28B, and 28C, a plurality of relatively small solar battery cells 2 each having a comb-like front electrode 2a are electrically series-connected in such a manner that a portion of each solar battery cell 2 is overlapped with a portion of each adjacent cell 2, in a so-called roof-tile-stacked manner. A back electrode (not shown) is formed on approximately the entire back surface of each of these small solar battery cells 2, and a portion of the front electrode 2a of one solar battery cell 2 is directly attached to the back electrode of its adjacent solar battery cell 2. Solar battery cells 2 on opposite ends of a series of the roof-tile-stacked solar battery cells 2 are connected with interconnectors 3.

In the roof-tile-stacked solar battery module 1D shown in FIGS. 28A, 28B, and 28C also, when a portion of the solar battery cells 2 are shaded, there occurs the same problem of a substantial decrease in output current as described in FIGS. 21A and 21B.

In addition, since the roof-tile-stacked solar battery module 1D has poor flexibility, a crack is liable to be produced in a direction orthogonal to the direction of elongation of that module, as illustrated in FIGS. 29A and 29B. This crack is liable to be produced particularly in a long solar battery module in which a large number of solar battery cells 2 are connected in series. FIGS. 29A and 29B show, respectively, a top view and a longitudinal cross-sectional view of the solar battery module 1D including a cracked solar battery cell 2. When a crack 2K is formed completely across one solar battery cell 2 as shown in FIGS. 29A and 29B, the output of the entire solar battery module 1D decreases down to 0.

The diode 4 of the type shown FIG. 23D is employed in the solar battery module incorporating the prior art bypass diode 4. This diode 4 typically has a cylindrical form of approximately 3-4 mm in diameter and approximately 10 mm in length. On the other hand, the solar battery cell 2 has a thin plate form of, e.g., $100 \times 100 \times 0.4$ mm$^3$ in size.

Accordingly, when the solar battery module is laminated with and interposed between protection layers, the thin solar battery cell 2 sometimes cracks by being pressed by the thick diode 4. In addition, the overall laminated solar battery module becomes thick due to the thick diode 4, resulting in an increase in the overall weight of the module. Moreover, there is a problem such that if the diode 4 is provided in portions other than the solar battery cell, the size of the entire solar battery module increases by the proportion corresponding to the provision of the diode 4, and the module conversion efficiency (photoelectric conversion efficiency of the module with respect to the size of the module) decreases, resulting in a deterioration in the appearance of the product and a degradation in the value of the commodity. There is another problem that since the diode 4 is thick, a laminating step becomes complicated, resulting in a higher cost of the product.

Moreover, a solar battery module in which solar battery cells having a thin plate form and a relatively small size of, e.g., $30 \times 30 \times 0.4$ mm$^3$ are roof-tile-stacked, a crack is liable to be produced in the direction orthogonal to the elongated direction of the module as shown in FIGS. 29A and 29B. This results in a problems such that the output of the solar battery module is 0.

SUMMARY OF THE INVENTION

In view of the above-described problems of the prior art, one object of the present invention is to provide a solar battery module which has a good appearance and a high value and can be easily thinly laminated together with protection layers at a low cost without damaging thin solar battery cells.

Another object of the present invention is to provide a solar battery module in which even if a crack is produced in a roof-tile-stacked solar battery module, the output of the module does not decrease to zero but can be maintained at a very high level.

A solar battery module according to one aspect of the present invention includes a plurality of solar battery cells which are electrically series-connected by interconnectors, and one or more diodes which allow output currents of the solar battery cells to be bypassed with respect to one or more solar battery cells, wherein the diodes are chip shaped thin diodes and are attached to electrodes of the solar battery cells in a line in which the interconnectors are aligned.

A solar battery module according to another aspect of the present invention includes a plurality of solar battery cells, interconnectors for electrically series-connecting the plurality of solar battery cells, and one or more bypass diodes which allow output currents of the solar battery cells to be bypassed with respect to the solar battery cells, wherein the bypass diodes are chip shaped thin diodes and connected between two interconnectors extending from a from electrode and a back electrode of a solar battery cell to be bypassed.

A solar battery module according to still another aspect of the present invention includes a plurality of solar battery cells which are electrically series-connected, and one or more bypass diodes which allow output currents of the solar battery cells to be bypassed with respect to the plurality of solar battery cells, wherein cells of the plurality of series-connected solar battery cells to be bypassed, which are on opposite ends are disposed in close proximity to each other, and the bypass diodes are pellet-like thin diodes attached to an electrode of one of the cells on the opposite ends.

A solar battery module according to still another aspect of the present invention includes a plurality of solar battery cells which are electrically connected in series by roof-tile-stacking, and one or more bypass diodes which allow output currents of these solar battery cells to be bypassed with respect to one or more solar battery cells, wherein the bypass diodes are pellet-like thin diodes attached to back electrodes of the solar battery cells.

In the solar battery module in accordance with the present invention, since pellet-like diodes which are as thin as solar battery cells are directly attached as bypass diodes on the electrode of the solar battery cells or on the interconnectors, it is possible to provide a solar battery module which has a good appearance and a high value and can be thinly laminated together with protection layers easily at a low cost without damaging the thin solar battery cells.

In addition, in the roof-tile-stacked solar battery module according to the present invention, since an interconnector is provided on the back electrode of each solar battery cell, even if a crack is produced in any of the solar battery cells, the output of the solar battery module does not decrease to zero and the decrease of the output can be minimized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A, 5B, and 5C are diagrams showing the step of attaching a diode interconnector to the bypass diode according to one embodiment of the present invention.

FIGS. 15A, 15B, 15C, and 15D are diagrams showing a roof-file-stacked solar battery module according to a still further embodiment of the present invention.

FIGS. 19A, 19B, and 19C are diagrams showing one example of a conventional solar battery module.

FIGS. 20A and 20B are diagrams showing output voltage-current (V-I) characteristics of a single solar battery cell.

FIGS. 21A and 21B are diagrams showing V-I characteristics of an entire solar battery module.

FIGS. 22A and 22B are diagrams showing one example of a conventional solar battery system including a plurality of solar battery modules.

FIGS. 23A, 23B, and 23C are diagrams showing one example of a solar battery module incorporating a prior art bypass diode.

FIGS. 24A and 24B are diagrams showing V-I characteristics of a prior art solar battery cell including a bypass diode.

FIGS. 26A, 26B, and 26C are diagrams showing an example of a prior an solar battery module including only one bypass diode.

FIGS. 27A and 27B are diagrams showing a prior art solar battery system including one bypass diode for each solar battery module.

DESCRIPTION OF THE PREFERRED EMBODIMENTS

Figure 1B:
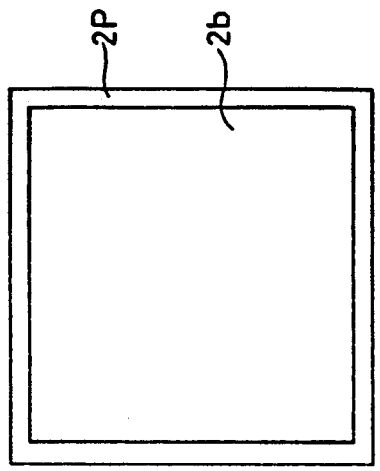
FIGS. 1A, 1B, and 1C are diagrams schematically showing on example of a solar battery cell for use in a solar battery module of the present invention.
Figure 1A:
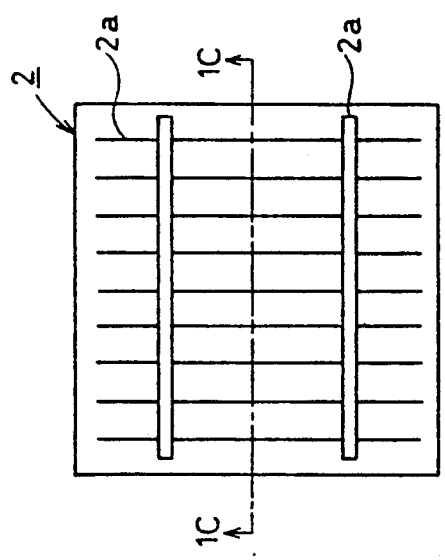
Figure 1C:
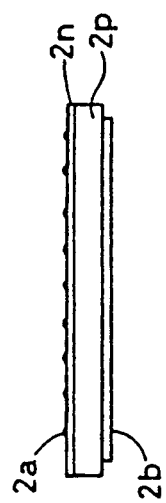

With reference to FIGS. 1A, 1B, and 1C, one example of a solar battery cell for use in a solar battery module according to an embodiment of the present invention is schematically illustrated. FIGS. 1A and 1B are, respectively, a top plan view and a bottom plan view of the solar battery cell; and FIG. 1C is a cross-sectional view taken along line 1C—1C of FIG. 1A. In this solar battery cell 2, an n type semiconductor layer $2n$ is formed on one main surface of a p type semiconductor substrate $2p$. A front electrode $2a$ is formed on the n type layer $2n$, while a back electrode $2b$ is formed on the other main surface of the p type substrate $2p$. The solar battery cell 2 is of a thin plate form having a size of, e.g. $100 \times 100 \times 1.4$ mm$^3$.

Figure 2A:
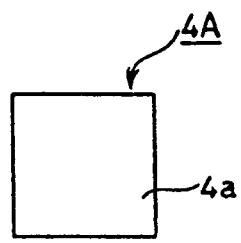
FIGS. 2A, 2B, and 2C are diagrams schematically showing one example of a pellet-like thin bypass diode for use in the solar battery module of the present invention.
Figure 2B:
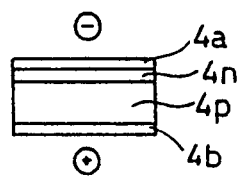
Figure 2C:
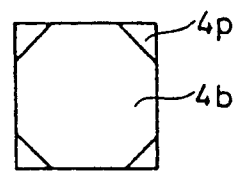

With reference to FIGS. 2A, 2B, and 2C, one example of a chip-like bypass diode employed in a solar battery module according to one embodiment of the present invention is schematically illustrated. FIGS. 2A, 2B, and 2C are, respectively, a top plan view, a side view, and a bottom view of the chip-like diode. In this chip shaped diode 4A, an n type semiconductor layer $4n$ is formed on one main surface of a p type semiconductor substrate $4p$. A front electrode $4a$ is formed on the n type layer $4n$, while a back electrode $4b$ is formed on the other main surface of the p type substrate. As can be understood from FIGS. 2A and 2C, the back electrode 4b has a different shape from that of the front electrode 4a so as to easily distinguish the front and the back of the diode 4A. Those front and back electrodes 4a and 4b are coated with solder.

This chip shaped diode 4A is of a thin plate form having a size of e.g., $3 \times 3 \times 0.44$ mm$^3$. That is, the chip shaped diode 4A has a thickness of 0.4 mm, far smaller than the 3-4 mm thickness of the conventional diode 4 shown in FIGS. 23D. Preferably, the diode 4A has a thickness of no more than 0.5 mm.

Figure 3A:
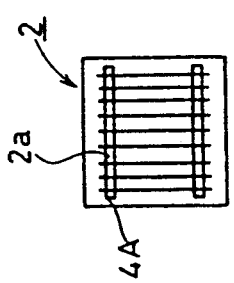
FIGS. 3A, 3B, and 3C are diagrams showing the step of attaching a bypass diode to an electrode of a solar battery cell according to one embodiment of the present invention.
Figure 3B:
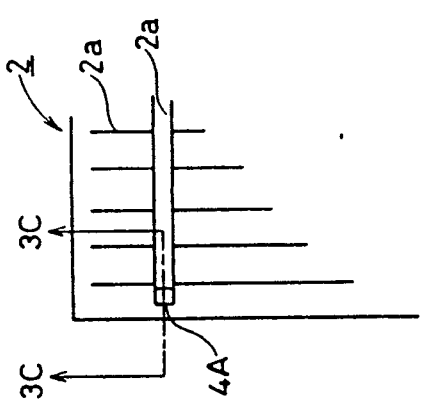
Figure 3C:
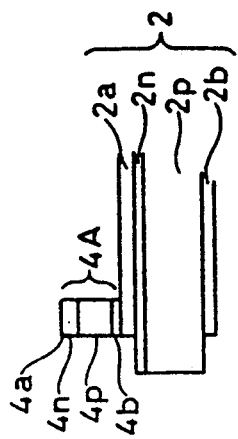

With reference to FIGS. 3A, 3B, and 3C, the step of attaching a bypass diode to an electrode of a solar battery cell is illustrated. Referring to FIG. 3A, the chip shaped diode 4A is mounted on one end of the front electrode 2a of the solar battery cell 2, then heated and soldered thereon. FIG. 3B is a partially enlarged view of the solar battery cell 2 with the chip shaped diode 4A attached thereon; and FIG. 3C is an enlarged cross-sectional view taken along a line 3C—3C of FIG. 3B.

Figure 4B:
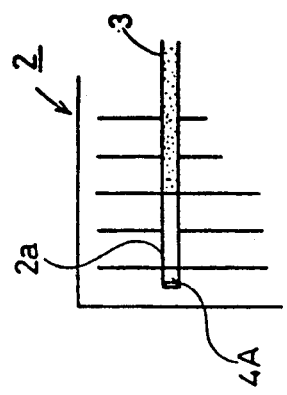
FIGS. 4A and 4B are diagrams showing the step of connecting an interconnector to the electrode of the solar battery cell according to one embodiment of the present invention.
Figure 4A:
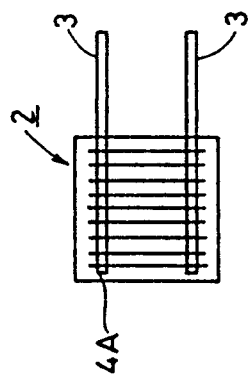

With reference to FIGS. 4A and 4B, the step of attaching an interconnector 3 for series-connecting a plurality of solar battery cells 2, on the front electrode 2a of the solar battery cell 2 is shown. FIG. 4A shows the solar battery cell 2 on which the chip shaped diode 4A and the interconnector 3 are attached; and FIG. 4B is ia partially enlarged view of FIG. 4A.

Referring to FIG. 5A, an interconnector 3a for electrically connecting the bypass diode 4A is soldered on the diode 4A. FIG. 5B is a partially enlarged view of the solar battery cell 2 with the diode interconnector 3a attached on the bypass diode 4A; and FIG. 5C is an enlarged cr taken along a line 5C—5C of FIG. 5B. While the diode interconnector 3a is attached after the diode 4A is attached to the solar battery cell 2 in this embodiment, the diode 4A may be attached on the solar battery cell 2 after the diode interconnector 3a is attached in advance to the diode 4A.

Figure 6A:
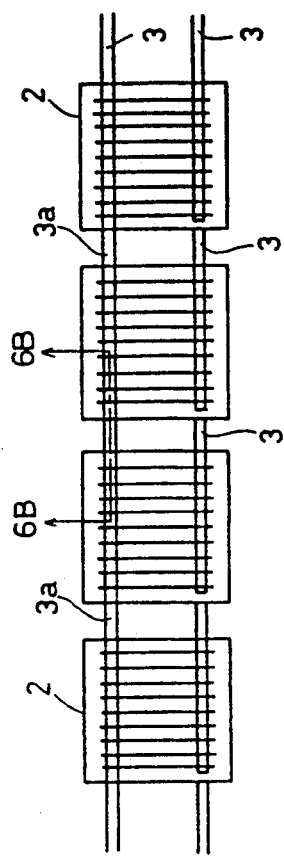
FIGS. 6A and 6B are diagrams showing a solar battery module in which a plurality of solar battery cells are series-connected by interconnectors according to one embodiment of the present invention.
Figure 6B:
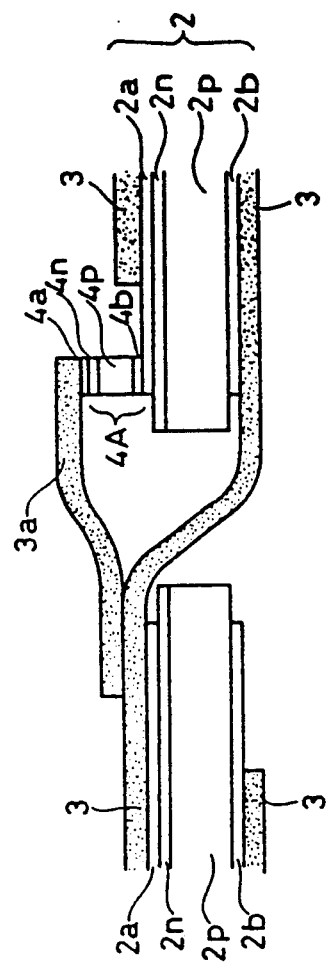

FIG. 6A is a top view of a solar battery cell module in which a plurality of solar battery cells 2 are series-connected. FIG. 6B is an enlarged cross-sectional view taken along line 6B—6B of FIG. 6A. In this solar battery module, each of the solar battery cells 2 includes the bypass diode 4A connected on its front electrode 2a. The bypass diode 4A is connected to the front electrode 2a of any adjacent solar battery cell 2 by the diode interconnector 3a.

Figure 7A:
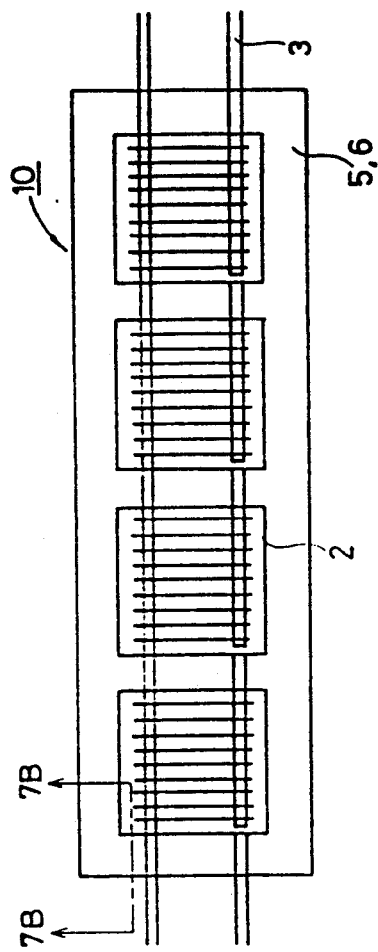
FIGS. 7A, 7B, and 7C are diagrams showing the step of laminating the solar battery module together with protection layers according to one embodiment of the present invention.
Figure 7C:
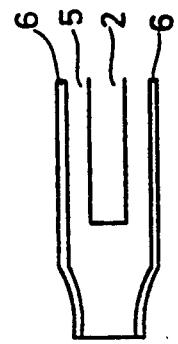
Figure 7B:
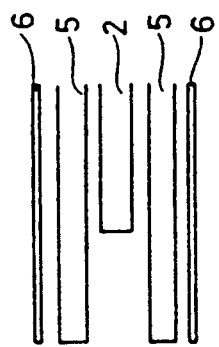

Referring to FIG. 7A, the solar battery module of FIG. 6A is laminated with and interposed between protection layers. FIG. 7B is an enlarged cross sectional view taken along line 7B—7B of FIG. 7A. The solar battery cell 2 is interposed between resin filler layers 5 such as of an EVA resin and transparent films 6 on the outside of the resin filler layers 5. After that, these protection layers 5 and 6 are heated under pressure. Consequently, the solar o battery cell 2 is laminated with the protection layers 5 and 6 adhering to each other as shown in FIG. 7C, thereby completing a solar battery module 10.

In assembly of the above solar battery module, complicated interconnectors or connections which have been required between the conventional bypass diode 4 and the solar battery cell 2 are simplified, enabling a reduction in manufacturing cost. In addition, since the bypass diode 4A is directly connected to a solar battery cell plate, it is possible to allow heat generated when a current flows through the bypass diode 4A to efficiently escape through the solar battery cell plate, and thus prevent overheating of the bypass diode 4A.

Further, since the chip shaped bypass diode 4A has a thickness of 0.4 mm, far smaller than the 3-4 mm thickness of the conventional normal diode, the above-described laminated solar battery cell does not become thick and the thin solar battery cell 2 is not damaged by being pressed by a conventional thick bypass diode. Moreover, since the thin chip shaped bypass diode is aligned along the interconnector 3, the finished solar battery module 10 has a good appearance and a high product value.

Figure 8A:
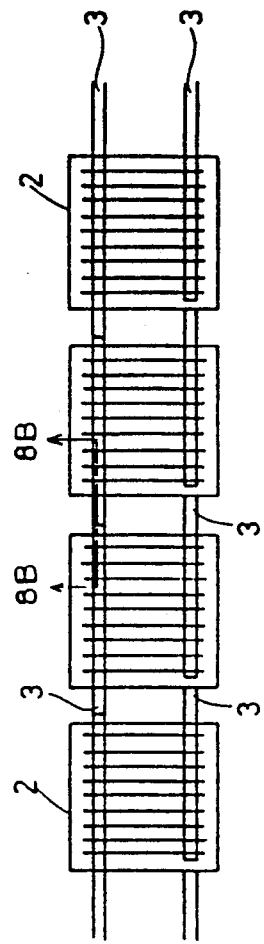
FIGS. 8A and 8B are diagrams showing a solar battery module according to another embodiment of the present invention.
Figure 8B:
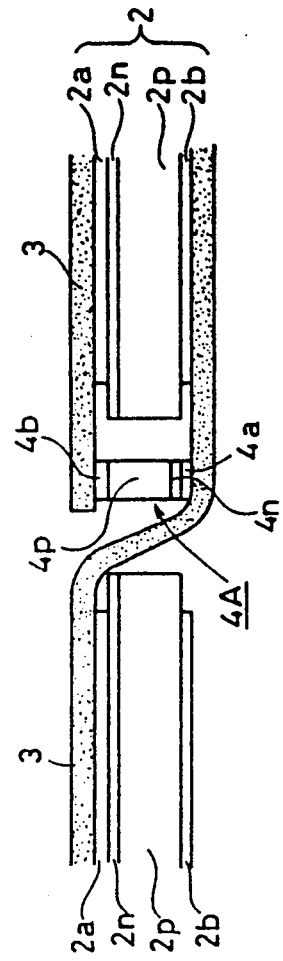

FIG. 8A shows a front view of a solar battery module according to another embodiment of the present invention. FIG. 8B shows an enlarged cross-sectional view taken along line 8B—8B of FIG. 8A. In this solar battery module, a chip shaped bypass diode 4A is attached in parallel with each of solar battery cells 2 and between interconnectors 3 which are attached, respectively, to a front and a back side of each solar battery cell 2. In that case, since the bypass diode 4A has a thickness of approximately 0.4 mm, identical to that of the solar battery cell 2, the bypass diode 4A does not increase the thickness of the solar battery module. Although the solar battery module of FIGS. 8A and 8B is laminated together with protection layers 5 and 6 in the same manner as described in association with FIGS. 7A, 7B, and 7C, the bypass diode 4A does not apply an undesired force to the solar battery cell 2 during pressure attachment at that time.

Figure 9A:
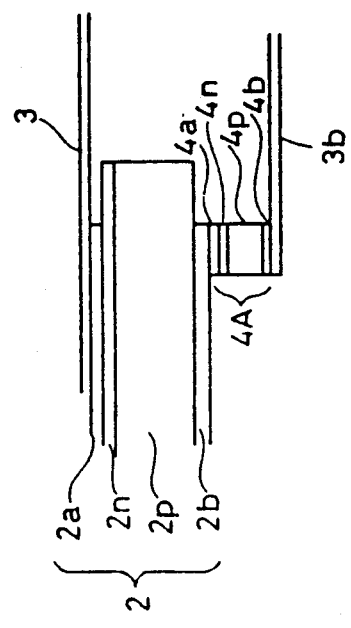
FIGS. 9A and 9B are diagrams showing a solar battery module according to a further embodiment of the present invention.
Figure 9B:
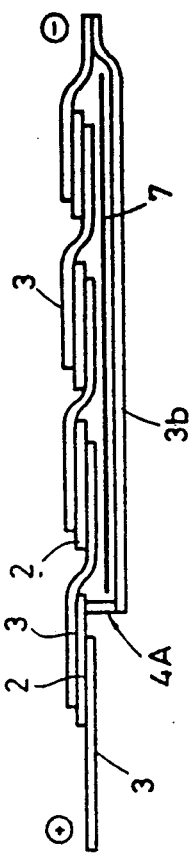

With reference to FIGS. 9A and 9B, still another embodiment of the present invention is illustrated. In this embodiment, as shown in an enlarged partial cross-sectional view of FIG. 9A, a chip shaped bypass diode 4A is attached to a back electrode 2b of one solar battery cell 2. An interconnector 3 for series-connecting a plurality of solar battery cells 2 is attached to a from electrode of that solar battery cell 2, and a bypass interconnector 3b is attached to a lower electrode 4b of the bypass diode 4A.

FIG. 9B shows a solar battery module including a plurality of solar battery cells 2 which are electrically connected by the interconnectors 3 and 3b. In this case, the bypass interconnector 3b is electrically insulated from the other interconnector 3 or the like by an insulating sheet 7. As will be understood from FIG. 9B, when a reverse bias voltage is generated in this solar battery module, not individual solar battery cells 2 but the entire solar battery module is bypassed via the bypass diode 4A and the bypass interconnector 3b. The solar battery module of FIG. 9B is also laminated together with the same protection layers as described in association with FIGS. 7A, 7B, and 7C.

Figure 10B:
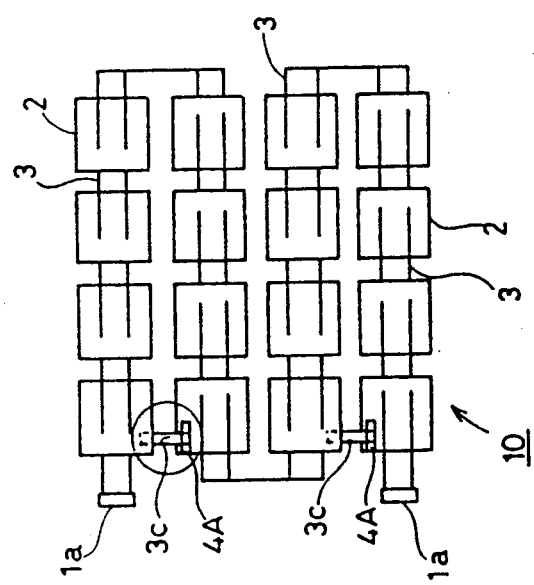
FIGS. 10A and 10B are diagrams showing a solar battery module according to a still further embodiment of the present invention.
Figure 10A:
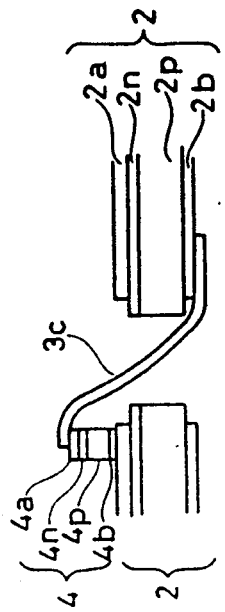

With reference to FIGS. 10A and 10B, still another embodiment is illustrated. In the solar battery module 10 of FIG. 10A, 16 solar battery cells 2 arranged in a matrix of 4 rows and 4 columns are series-connected between two output terminals 1a. FIG. 10B shows an enlarged cross-sectional view of the encircled portion in FIG. 10A. A chip shaped bypass diode 4A attached to a front electrode 2a of one solar battery cell 2 is connected to a back electrode of another solar battery cell 2 on its adjacent row by a diode interconnector 3c. That is, in the solar battery module of FIG. 10, when a reverse bias voltage is generated, every pair of rows of solar battery cells 2, i.e., 8 solar battery cells 2 are bypassed via the diode 4A and the diode interconnector 3c. In that case, since the diode interconnector 3c is connected to its adjacent solar battery cell 2, the interconnector 3c can be made far shorter than the bypass interconnector 3b shown in FIG. 9B and does not require any insulating sheet 7. The solar battery module of FIG. 10A is also laminated together with the same protection layers as described in association with FIGS. 7A, 7B, and 7C.

Figures 11A, 11B:
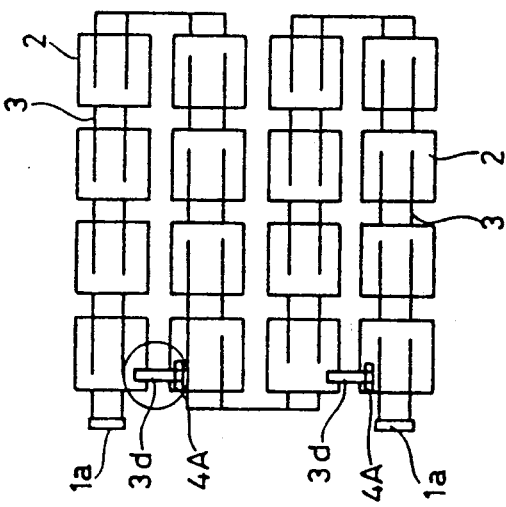
FIGS. 11A and 11B are diagrams showing a solar battery module according to a still further embodiment of the present invention.

With reference to FIGS. 11A and 11B, still another embodiment is illustrated. While this embodiment is similar to the embodiment of FIGS. 10A and 10B, a diode interconnector 3d is connected to a from electrode rather than a back electrode of an adjacent solar battery cell 2 of a solar battery cell 2 on which a bypass diode 4A is mounted. In this case, since the diode interconnector 3d is connected to a top surface of each of the diode and the solar battery cell 2, the step of attaching the diode interconnector 3d is made easier. In that case, the solar battery cell 2 in which the diode interconnector is attached to its front electrode 2a is not bypassed; however, the number of such cells is only two out of 16 cells included in the module, and hence, a sufficiently meaningful bypass function can be exhibited in practice.

Figure 12B:
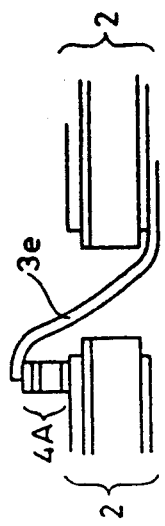
FIGS. 12A and 12B are diagrams showing a solar battery module according to a still further embodiment of the present invention.
Figure 12A:
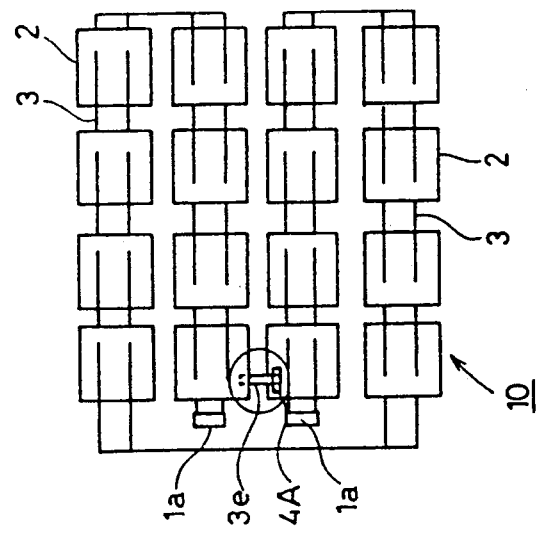

With reference to FIGS. 12A and 12B, still another embodiment is illustrated. This embodiment is similar to that of FIGS. 10A and 10B, but solar battery module 10 has only one bypass diode 4A. That is, as will be apparent from FIGS. 10A and 10B, two cells 2 which are on opposite ends of series-connected solar battery cells 2 and are directly connected to two output terminals 1a are arranged adjacently, and a bypass circuit is formed in between these two cells 2 on the opposite ends. Thus, when a reverse bias voltage is generated, the entire solar battery module 10 is bypassed.

Figure 13B:
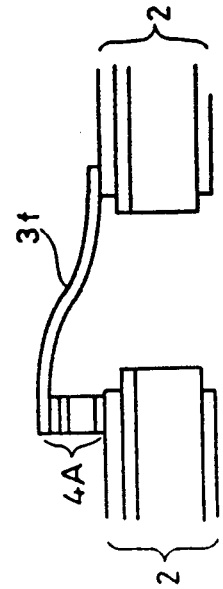
FIGS. 13A and 13B are diagrams showing a solar battery module according to a still further embodiment of the present invention.
Figure 13A:
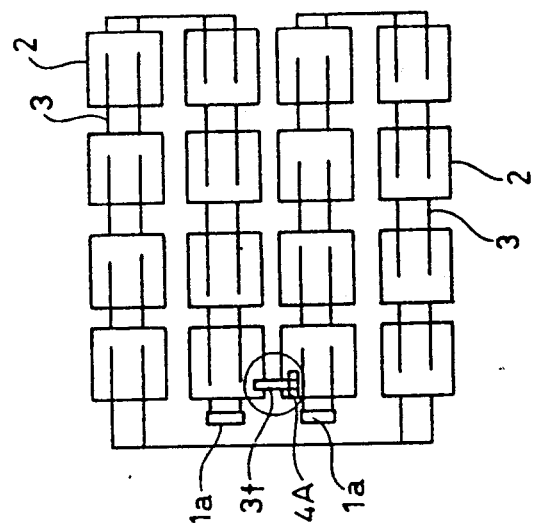

With reference to FIGS. 13A and 13B, still another embodiment is illustrated. This embodiment is similar to that of FIGS. 12A and 12B, but a diode interconnector 3f is connected to a front electrode rather than a back electrode of an adjacent solar battery cell 2 on which a bypass diode 4A is mounted.

Figure 14:
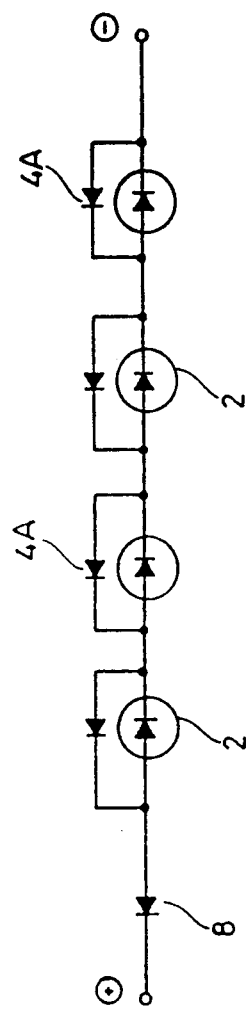
FIG. 14 is an equivalent circuit diagram showing a solar battery module according to a still further embodiment of the present invention.

In the above-described embodiments, any solar battery module may include a diode 8 for preventing a reverse current as exemplified in the equivalent circuit diagram of FIG. 14. This reverse current preventing diode 8 is a chip shaped diode and may be attached to a solar battery cell 2 at one end of a plurality of series-connected battery cells 2.

Moreover, while a bypass diode is provided at one position on a single solar battery cell in any of the foregoing embodiments, bypass diodes may be mounted at two or more positions on a single solar battery cell, thereby enabling a reduction in a resistance developed when a current flows through the bypass diodes.

FIGS. 15A, 15B, 15C, and 15D show, respectively, a bottom view, a top view, a longitudinal cross-sectional view, and an equivalent circuit diagram of a solar battery module according to still another embodiment of the present invention. In this solar battery module 1F, each of solar battery cells 2 having a comb-like front electrode 2a has a thin plate form and a relatively small size of, e.g., $30 \times 30 \times 0.4$ mm$^3$, and a back electrode (not shown) is formed on approximately the entire back surface of each cell. The plurality of solar battery cells 2 are roof-tile-stacked with portions of the respective cells 2 being overlapped with each other, whereby a part of the front electrode 2a is directly connected to the back electrode of an adjacent solar battery cell 2.

The solar battery module 1F of FIGS. 15A and 15C further includes pellet-like bypass diodes 4A each having a thin plate form of a relatively small size of, e.g., $3 \times 3 \times 0.4$ mm$^3$. Each bypass diode 4A is disposed in an edge portion of the solar battery cell 2 to be bypassed by that bypass diode, and one main surface of the chip shaped diode 4A is attached to the back electrode of an adjacent cell 2 of the solar battery cell 2 to be bypassed. The other main surface of the bypass diode 4A is attached to an interconnector 3g which extends and is soldered on the back electrode of the solar battery cell 2 to be bypassed by that diode 4A.

In the solar battery module of FIGS. 15A, 15B, and 15C, complicated interconnections or connections which previously have been necessary between the conventional bypass diodes 4 and the solar battery cells 2 are simplified. Further, since the chip shaped bypass diodes 4A are attached onto step portions of the roof-tile-stacked solar battery cells 2, the thickness of the solar battery module 1F is not increased. In addition, since the bypass diodes 4A are attached on the back surface of the solar battery module 1F, the front surface of the module 1F has a good appearance.

Figure 16A:
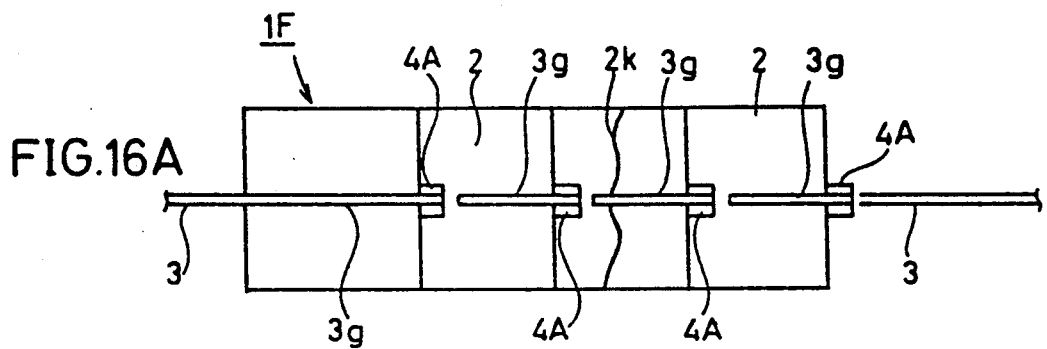
FIGS. 16A, 16B, and 16C are diagrams showing a crack produced in the roof-tile-stacked solar battery module of FIGS. 15A, 15B and 15C.
Figure 16B:
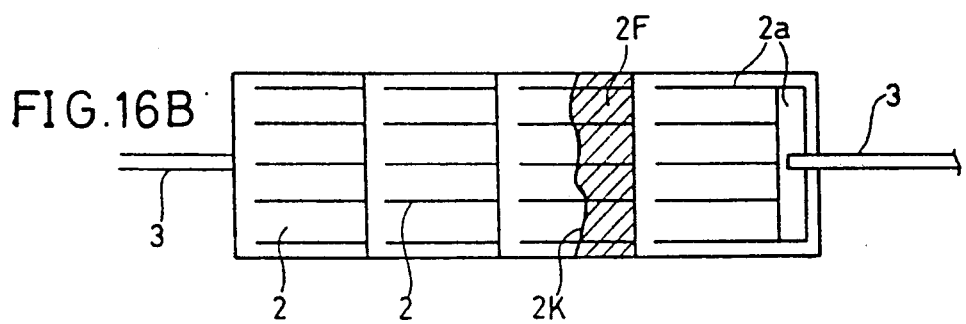
Figure 16C:
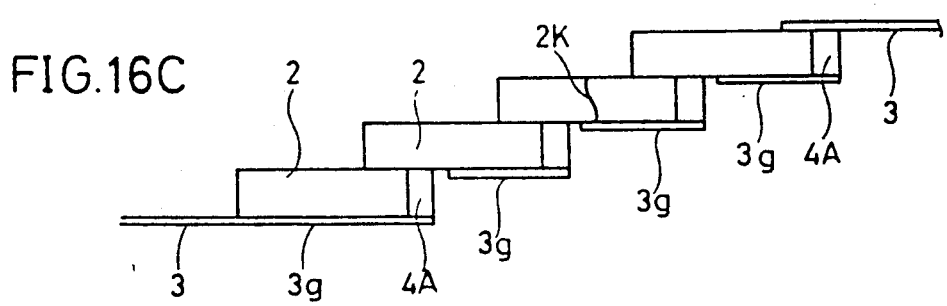

FIGS. 16A, 16B, and 16C illustrate the state where a crack 2K is produced in one of the solar battery cells 2 in the solar battery module 1F of FIGS. 15A, 15B, and 15c. FIGS. 16A, 16B, and 16C show, respectively, a bottom view, a top view, and a longitudinal cross-sectional view. As will be apparent from these figures, even if the crack 2K occurs, the electrical continuity of the back electrode of the cracked solar battery cell 2 is retained by the interconnector 3g thereon, resulting in no substantial decrease in the output of the entire solar battery module 1F. It will also be understood that a photovoltaic force applied from a hatched area 2F in FIG. 16B can still contribute to the output of the solar battery module 1F even in the solar battery cell 2 having the crack 2K therein.

Figure 17A:
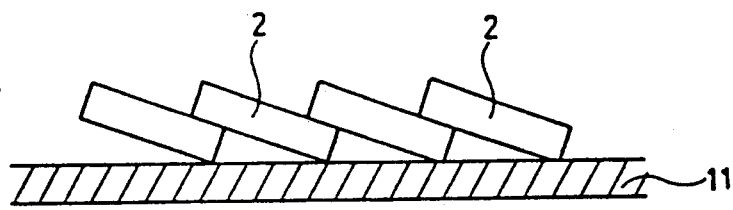
FIGS. 17A, 17B, and 17C are diagrams showing the step of assembling the roof-tile-stacked solar battery module of FIG. 15C.
Figure 17B:
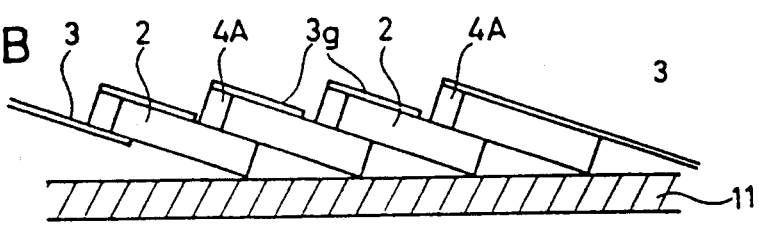
Figure 17C:
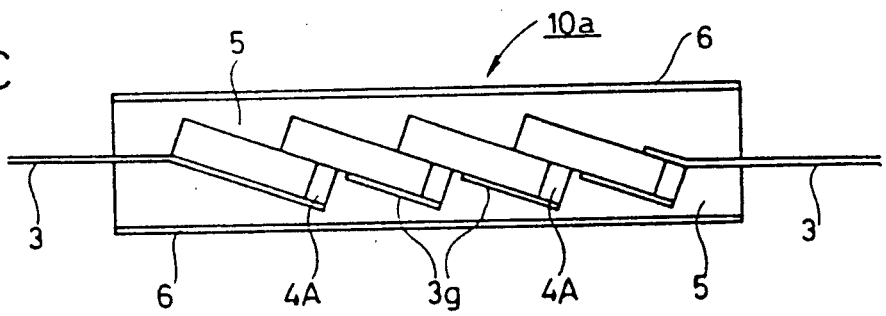

With reference to the cross-sectional views of FIGS. 17A, 17B, and 17C, the steps of assembling the solar battery module as shown in FIG. 15C are illustrated. Referring to FIG. 17A, solar battery cells 2 are arranged in a roof-tile-stacked manner on, e.g., an aluminum plate 11 with the back surfaces of the cells facing upward. Referring to FIG. 17B, chip shaped bypass diodes 4A are attached onto the stepped portions of the roof-tile-stack, and interconnectors 3g cut in an appropriate length are extended over the back electrode from the diodes 4A to the solar battery cells 2. With this state maintained, if the solar battery module is placed on a hot plate heated to two hundred and several tens of ° C. or put in an oven, the diodes 4A and the interconnectors 3g are soldered. After the soldering is completed, the solar battery module is taken out from the hot plate or the oven and then undergoes natural cooling. It will be understood that by use of a jig having an appropriate groove or a positioning pin, the solar battery cells can be connected in a roof-tile-stacked manner with their front surfaces facing upward.

Figure 18:
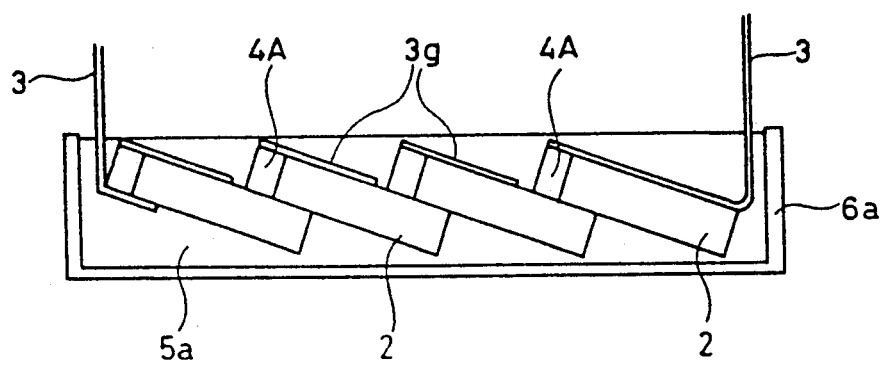
FIG. 18 is a diagram showing a roof-tile-stacked solar battery module according to a still further embodiment of the present invention.
Figure 25A:
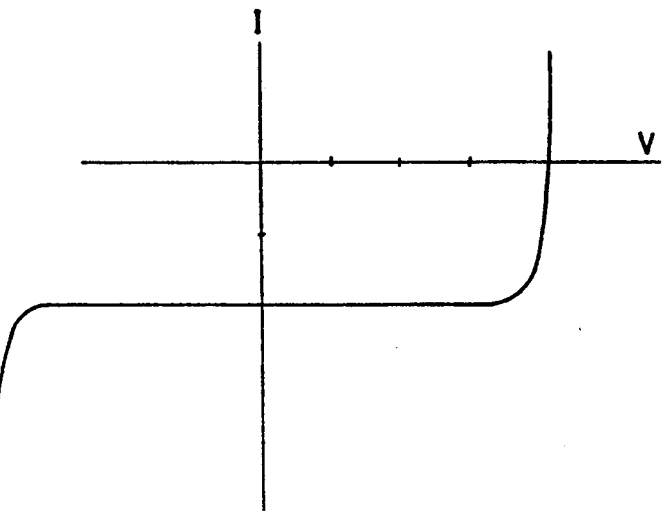
FIGS. 25A and 25B are diagrams showing V-I characteristics of a prior art solar battery module including a bypass diode.
Figure 25B:
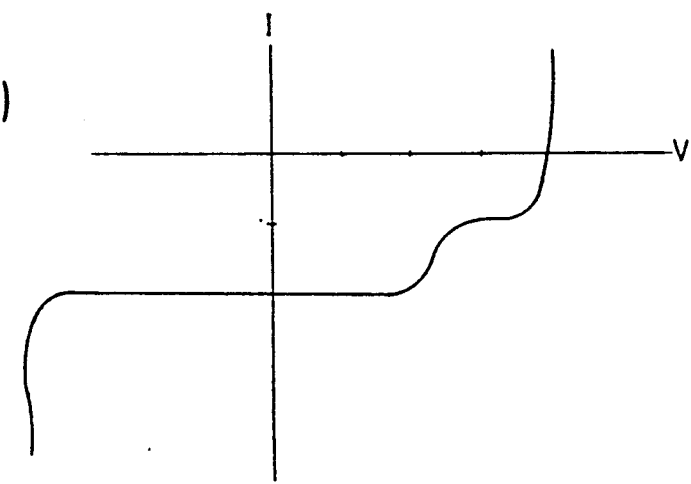
Figure 28A:
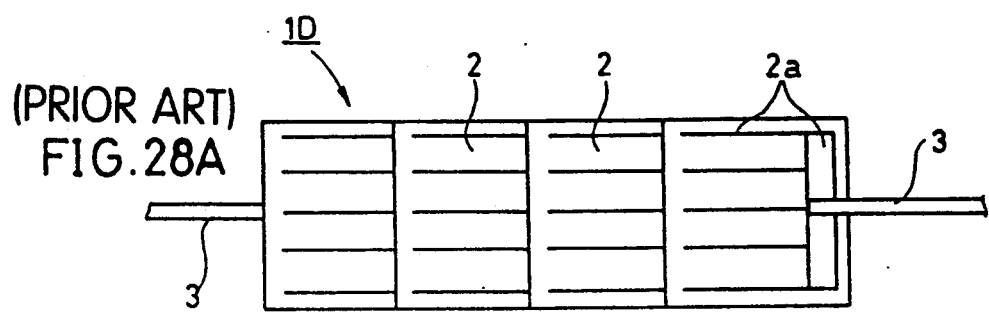
FIGS. 28A, 28B, and 28C are diagrams showing a conventional roof-tile-stacked solar battery module.
Figure 28B:
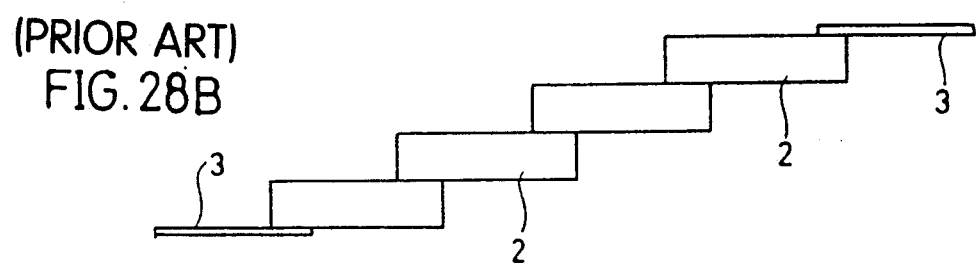
Figure 28C:
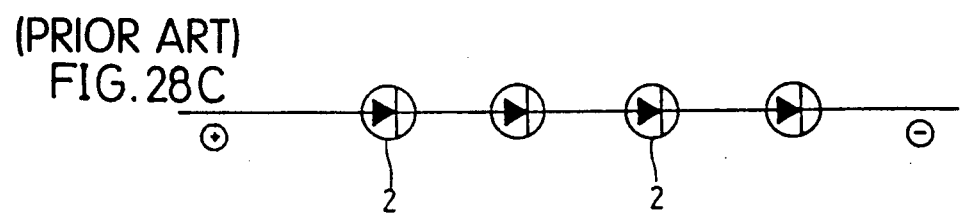
Figure 29A:
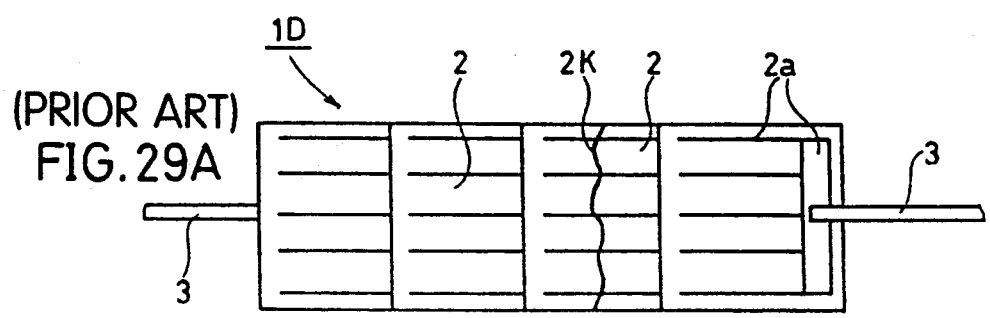
FIGS. 29A and 29B are diagrams showing the state where a crack is produced in the roof-tile-stacked solar battery module of FIGS. 28A and 28B.
Figure 29B:
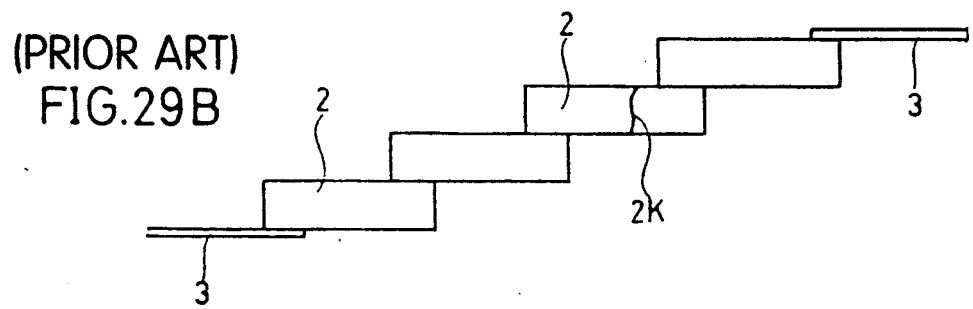

After that, the solar battery module is laminated (heated under pressure) with a filler resin 5 such as EVA resin and a transparent film 6, as shown in FIG. 17C. This completes a solar battery module 10a of roof-tile-stacked type laminated with a protection layer. Alternatively, the solar battery module can be placed in a polycarbonate container 6a with the light receiving surface of each solar battery cell facing downward, and can be hardened by being filled with a silicone resin 5a for protection, as shown in a cross-sectional view of FIG. 18.

As has been described, according to the present invention, since a chip-like diode as thin as a solar battery cell is directly attached as a bypass diode to an electrode of a solar battery cell or to an interconnector, it is possible to provide a solar battery module which has a good appearance and a high value and can be thinly laminated together with protection layers easily at a low cost without damaging the thin solar battery cells.

In addition, according to the present invention, it is possible to provide a solar battery module which is able to maintain an output at a very high level without being decreased to 0 even if a crack is made in a roof-tile-stacked solar battery module.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar battery module, comprising:
a plurality of solar battery cells arranged in a linear array;
each said cell including a front electrode and a back electrode, each front electrode including a plurality of parallel conductors located on a light receiving surface of each cell and extending in a direction along the length of said linear array;
said cells being electrically series-connected by interconnectors connected to each of said electrodes and extending in a direction along the length of said linear array; and
each said cell including a bypass diode which allows output currents of said solar battery cells to be bypassed with respect to one of said solar battery cells, wherein
each said bypass diode is a chip shaped thin diode and is attached to one of said parallel conductors of a front electrode of a cell and connected to an adjacent cell front electrode by an interconnector extending in a direction along the length of said linear array.

2. The solar battery module of claim 1, wherein each said solar battery cell bypass diode has a width substantially equal to a width of one of said parallel conductors.

3. The solar battery module of claim 1, wherein said bypass diode has a thickness of approximately not more than 0.5 mm.

4. The solar battery module of claim 1, wherein said solar battery module is laminated together with a protective layer.

5. A solar battery module, comprising:
a plurality of solar battery cells arranged in a linear array;
each said cell including a front electrode and a back electrode, each front electrode including a plurality of parallel conductors located on a light receiving surface of each cell and extending in a direction along the length of said linear array;
interconnectors connected to each of said electrodes for electrically series-connecting said plurality of said solar battery cells, said interconnectors extending in a direction along the length of said linear array; and
each said cell including a bypass diode which allows output currents of said solar battery cells to be bypassed with respect to one of said solar battery cells, wherein
each said bypass diode is a chip shaped thin diode and is attached between two of said interconnectors extending from a front electrode and a back electrode of said solar battery cell to be bypassed, and each said interconnector extending from a back electrode of one cell to a front electrode of an adjacent cell.

6. The solar battery module of claim 5, wherein each said solar battery cell bypass diode has a width substantially equal to a width of one of said parallel conductors.

7. The solar battery module of claim 5, wherein said bypass diode has a thickness of approximately not more than 0.5 mm.

8. The solar battery module of claim 5, wherein said solar battery module is laminated together with a protection layer.

9. A solar battery module comprising:
a plurality of solar battery cells which are electrically series-connected and arranged in a matrix array of rows and columns; and
each said cell including a front electrode and a back electrode, each front electrode including a plurality of parallel conductors located on a light receiving surface of each cell and extending in a direction along the length of said linear array;
at least one bypass diode for each two rows of the matrix array, which allows output currents of said solar battery cells of the respective two rows to be bypassed with respect to said plurality of solar battery cells, wherein
solar battery cells on opposite ends of each said two rows of said plurality of series-connected solar battery cells to be bypassed are arranged in close proximity to each other, and
said bypass diode is a chip shaped thin diode and is attached on a front electrode of one of said opposite end cells of each said two rows.

10. The solar battery module of claim 9, wherein said bypass diode has a thickness of approximately not more than 0.5 mm.

11. The solar battery module of claim 9, wherein said solar battery module is laminated together with a protection layer.

12. A solar battery module, comprising:
a plurality of solar battery cells electrically connected in series by roof-tile-stacking, each said cell including a front electrode on a light receiving surface and a back electrode; and
at least one bypass diode which allows output currents of said solar battery cells to be bypassed with respect to at least one of said solar battery cells, wherein
said bypass diode is a chip shaped thin diode and is attached on a back electrode of said solar battery cell and wherein
said solar battery cell is provided with an interconnector extending on its back electrode and being attached to one end of said bypass diode, the other end of which is attached to the back electrode of an adjacent solar battery cell, the extending portion of said interconnector serving to minimize a decrease of the output when said solar battery cell is cracked.

13. The solar battery module of claim 12, wherein each of said solar battery cells includes one said bypass diode.

14. The solar battery module of claim 12, wherein said bypass diode has the same thickness as that of a said solar battery cell.

15. The solar battery module of claim 12, wherein said solar battery module is laminated together with a protection layer.

* * * * *